(12) United States Patent
Park

(10) Patent No.: US 10,192,890 B2
(45) Date of Patent: Jan. 29, 2019

(54) TRANSISTOR ARRAY PANEL AND METHOD OF MANUFACTURING THEREOF

(71) Applicant: Samsung Display Co., Ltd., Yongin-si (KR)

(72) Inventor: Jae-Hyun Park, Yongin-si (KR)

(73) Assignee: Samsung Display Co., Ltd, Yongin-si (KR)

(*) Notice: Subject to any disclaimer, the term of this patent is extended or adjusted under 35 U.S.C. 154(b) by 0 days.

(21) Appl. No.: 15/454,337

(22) Filed: Mar. 9, 2017

(65) Prior Publication Data

US 2017/0338248 A1 Nov. 23, 2017

(30) Foreign Application Priority Data

May 18, 2016 (KR) .................. 10-2016-0060952

(51) Int. Cl.
| | |
|---|---|
| H01L 27/12 | (2006.01) |
| H01L 29/423 | (2006.01) |
| H01L 29/417 | (2006.01) |
| H01L 29/786 | (2006.01) |
| H01L 29/66 | (2006.01) |
| H01L 27/32 | (2006.01) |

(52) U.S. Cl.
CPC ........ *H01L 27/1225* (2013.01); *H01L 27/124* (2013.01); *H01L 27/1259* (2013.01); *H01L 29/41733* (2013.01); *H01L 29/42356* (2013.01); *H01L 29/66969* (2013.01); *H01L 29/7869* (2013.01); *H01L 29/78648* (2013.01); H01L 27/3258 (2013.01); H01L 27/3262 (2013.01)

(58) Field of Classification Search
CPC combination set(s) only.
See application file for complete search history.

(56) References Cited

U.S. PATENT DOCUMENTS

| 2013/0037812 A1 | 2/2013 | Park et al. |
| 2014/0239262 A1* | 8/2014 | Kim ............... H01L 51/5212 257/40 |
| 2014/0353607 A1 | 12/2014 | Kim |
| 2015/0123084 A1 | 5/2015 | Kim et al. |
| 2015/0144904 A1* | 5/2015 | Jeong ............. H01L 27/326 257/40 |
| 2016/0204167 A1* | 7/2016 | Jun ................. H01L 51/502 257/72 |

(Continued)

FOREIGN PATENT DOCUMENTS

| KR | 10-2013-0016936 | 2/2013 |
| KR | 10-2014-0113157 | 9/2014 |

(Continued)

*Primary Examiner* — Mamadou Diallo
(74) *Attorney, Agent, or Firm* — H.C. Park & Associates, PLC

(57) ABSTRACT

A transistor display panel including: a substrate; a gate electrode disposed on the substrate; a semiconductor that overlaps the gate electrode; an upper electrode disposed on the semiconductor; a source connection member and a drain connection member disposed on the same layer as the upper electrode and respectively connected with the semiconductor; a source electrode connected with the source connection member and the upper electrode; and a drain electrode connected with the drain connection member.

20 Claims, 16 Drawing Sheets

(56) References Cited

U.S. PATENT DOCUMENTS

| | | | |
|---|---|---|---|
| 2016/0379562 A1* | 12/2016 | Yoon | G09G 3/3233 |
| | | | 345/215 |
| 2017/0005152 A1* | 1/2017 | Hong | H01L 27/3248 |
| 2017/0236846 A1* | 8/2017 | Yamazaki | H01L 27/1225 |
| | | | 257/43 |
| 2017/0294497 A1* | 10/2017 | Lius | H01L 27/3272 |
| 2018/0033849 A1* | 2/2018 | Noh | H01L 27/3272 |
| 2018/0108720 A1* | 4/2018 | Kim | H01L 27/3262 |

FOREIGN PATENT DOCUMENTS

| KR | 10-2014-0142519 | 12/2014 |
|---|---|---|
| KR | 10-2015-0051824 | 5/2015 |
| KR | 10-2015-0057753 | 5/2015 |

* cited by examiner

FIG. 2
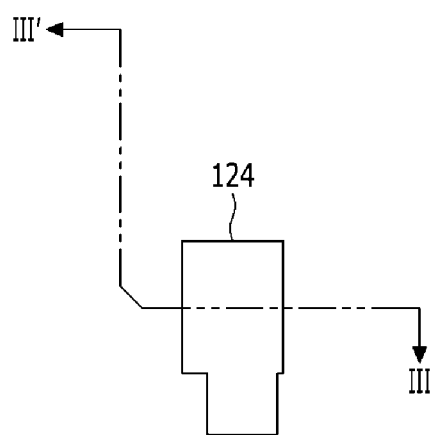
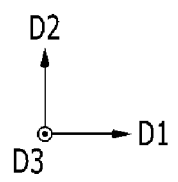

FIG. 4
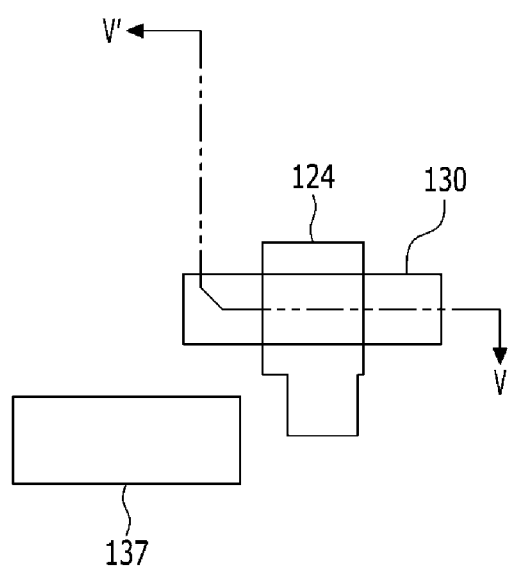
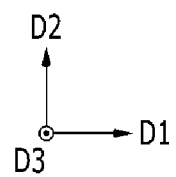

FIG. 6
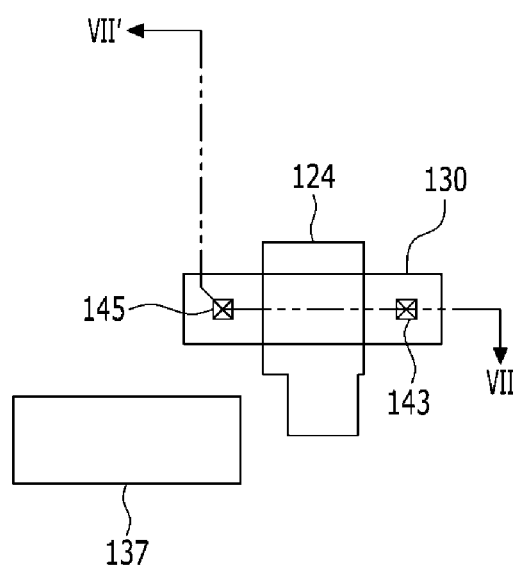
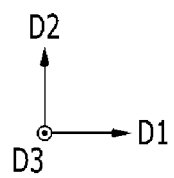

TRANSISTOR ARRAY PANEL AND METHOD OF MANUFACTURING THEREOF

CROSS-REFERENCE TO RELATED APPLICATION

This application claims priority from and the benefit of Korean Patent Application No. 10-2016-0060952, filed on May 18, 2016, which is hereby incorporated by reference for all purposes as if fully set forth herein.

BACKGROUND

Field

Exemplary embodiments relate to a transistor display panel and a method of manufacturing thereof.

Discussion of the Background

A transistor that is included in various electronic devices, such as a display device and the like, includes a gate electrode, a source electrode, a drain electrode, and a semiconductor. The transistor is used as a switch, a driving element, and the like.

The semiconductor element in a transistor is a key element that determines various characteristics of the transistor. Such a semiconductor mainly includes silicon (Si). Silicon is classified into amorphous silicon and polysilicon according to a crystallization type, wherein the amorphous silicon has a simple manufacturing process but has low charge mobility such that there is a limit in manufacturing a high performance thin film transistor, and the polysilicon has high charge mobility but a process of crystallizing the silicon is required such that the manufacturing cost is increased and the process is complicated. Recently, a transistor using an oxide semiconductor that has higher electron mobility than amorphous silicon, a high ON/OFF ratio, and lower cost and higher uniformity than polysilicon has been researched and developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a transistor display panel that can improve an output saturation characteristic of a transistor, and a method of manufacturing thereof.

Additional aspects will be set forth in the detailed description which follows, and, in part, will be apparent from the disclosure, or may be learned by practice of the inventive concept.

An exemplary embodiment discloses a transistor display panel including: a substrate; a gate electrode disposed on the substrate; a semiconductor that overlaps the gate electrode; an upper electrode disposed on the semiconductor; a source connection member and a drain connection member that are disposed on the same layer as the upper electrode and respectively connected with the semiconductor; a source electrode that is connected with the source connection member and the upper electrode; and a drain electrode that is connected with the drain connection member.

The upper electrode may overlap the semiconductor.

The transistor display panel may further include: a first insulation layer disposed between the gate electrode and the semiconductor; and a second insulation layer disposed between the semiconductor and the upper electrode.

The second insulation layer may include a first opening and a second opening that overlap the semiconductor and are disposed apart from each other, and the source connection member and the drain connection member may be connected with the semiconductor through the first opening and the second opening.

The transistor display panel may further include a third insulation layer that covers the upper electrode, the drain connection member, and the source connection member.

The third insulation layer may include a first contact hole, a second contact hole, and a third contact hole, the first contact hole and the second contact hole may respectively overlap the source connection member and the drain connection member, the source electrode may be connected with the source connection member and the upper electrode through the first contact hole and the third contact hole, and the drain electrode may be connected with the drain connection member through the second contact hole.

The transistor display panel may further include a pixel electrode that is electrically connected with the source electrode.

The semiconductor may include an oxide semiconductor.

The transistor display panel may further include a switching semiconductor spaced apart from the semiconductor and disposed on the same layer as the semiconductor, and a gate line disposed on the switching semiconductor, disposed on the same layer as the upper electrode, and transmitting a gate signal, wherein a portion of the gate line overlaps the switching semiconductor.

The transistor display panel may further include a connection electrode disposed on the same layer as the source electrode and connecting the switching semiconductor and the gate electrode.

The third insulation layer has a fourth contact hole overlapping the gate electrode, and a fifth contact hole overlapping the connection electrode, and one end portion of the connection electrode is connected to the gate electrode through the fourth contact hole, and the other end portion of the connection electrode is connected to the switching semiconductor through the fifth contact hole.

One end portion of the connection electrode overlaps the gate electrode in a plane view, and the other end portion of the connection electrode overlaps the switching semiconductor in a plane view.

The switching semiconductor comprises an oxide semiconductor.

The transistor display panel may further include a data line disposed on the same layer as the connection electrode, wherein a portion of the data line overlaps the switching semiconductor.

The portion of the data line is connected to the switching semiconductor.

An exemplary embodiment also discloses a method of manufacturing a transistor display panel. The method of manufacturing the transistor display panel includes: forming a gate electrode on a substrate; forming a semiconductor that overlaps the gate electrode; forming an upper electrode that overlaps the semiconductor and a source connection member and a drain connection member that are connected with the semiconductor; and forming a source electrode that is connected with the upper electrode and the source connection member and a drain electrode that is connected with the drain connection member.

The upper electrode may be formed on the semiconductor.

The method of manufacturing the transistor display panel may further include: forming a first insulation layer that covers the gate electrode; forming a second insulation layer that covers the semiconductor; and forming a first opening and a second opening in the second insulation layer, the first opening and the second opening overlapping the semiconductor. The source connection member and the drain connection member may be connected with the semiconductor respectively through the first opening and the second opening.

The method of manufacturing the transistor display panel may further include forming a third insulation layer that covers the upper electrode, the drain connection member, and the source connection member.

The method of manufacturing the transistor display panel further includes: forming a first contact hole, a second contact hole, and a third contact hole, the first contact hole and the second contact hole respectively overlapping the source connection member and the drain connection member and the third contact hole overlapping the upper electrode, wherein the source electrode may be connected with the source connection member and the upper electrode through the first contact hole and the third contact hole, and the drain electrode may be connected with the drain connection member through the second contact hole.

According to the exemplary embodiments, damage to the semiconductor, which may occur when the contact holes are formed, can be minimized.

In addition, a transistor characteristic, such as an output saturation characteristic, can be improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 2 is a top plan view illustrating a first step of a method of manufacturing the transistor display panel according to an exemplary embodiment.

FIG. 4 is a top plan view of the next step of FIG. 2.

FIG. 6 is a top plan view of the next step of FIG. 4.

DETAILED DESCRIPTION OF THE ILLUSTRATED EMBODIMENTS

Figure 1:
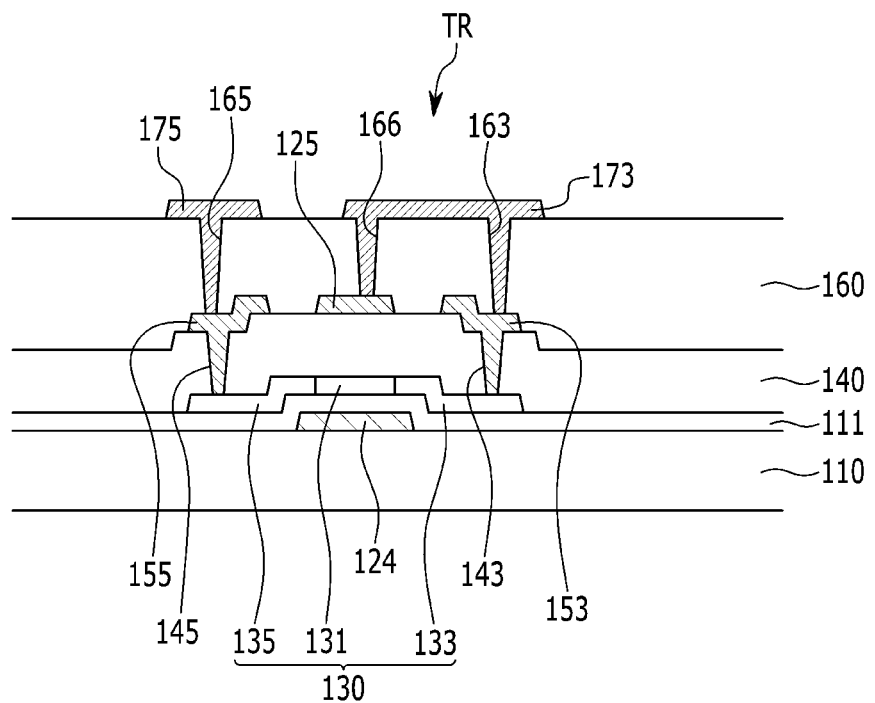
FIG. 1 is a cross-sectional view of a transistor display panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of a transistor display panel according to an exemplary embodiment.

Referring to FIG. 1, a transistor display panel according to an exemplary embodiment includes a substrate 110 that includes an insulation material such as plastic, glass, and the like, and a transistor TR that is disposed on the substrate 110.

The transistor TR includes a gate electrode 124, a semiconductor 130, an upper electrode 125, a drain connection member 155, a source connection member 153, a source electrode 173, and a drain electrode 175.

A first insulation layer 111 is disposed between the gate electrode 124 and the semiconductor 130, and a second insulation layer 140 is disposed between the semiconductor 130 and the upper electrode 125.

The semiconductor 130 includes a channel 131 that overlaps the gate electrode 124, a source region 133, and a drain region 135. The source region 133 and the drain region 135 are disposed at opposite sides of the channel 131. When a gate-on voltage is applied to the gate electrode 124, the source area 133 and the drain region 135 may be determined depending on a direction of carriers that flow through the channel 131, and the carriers flow to the drain electrode 135 from the source region 133. Thus, when the transistor TR operates, electrons flow to the drain region 135 from the source region 133 in an n-type transistor, and holes flow to the drain region 135 from the source region 133 in a p-type transistor.

The gate electrode 124 of the transistor TR is disposed on the substrate 110. The gate electrode 124 may be made of a conductive material, such as a metal and the like, and may be provided as a single layer or as multiple layers (multilayer). The gate electrode 124 may function as a light blocking film. That is, the gate electrode 124 prevents external light from reaching the semiconductor 130 to thereby prevent characteristic deterioration of the semiconductor 130 and control a leakage current of the transistor TR.

The first insulation layer 111 is disposed between the substrate 110 and the semiconductor 130 above the gate electrode 124. The first insulation layer 111 can protect the semiconductor 130 and improve the characteristic of the semiconductor 130 by preventing permeation of an impurity to the semiconductor 130 from the substrate 110, and accordingly, the first insulation layer 111 may be referred to as a "buffer layer".

The first insulation layer 111 may include an inorganic insulation material such as a silicon oxide ($SiO_x$), a silicon nitride ($SiN_x$), aluminum oxide ($Al_2O_3$), hafnium oxide ($HfO_3$), yttrium oxide ($Y_2O_3$), and the like. The first insulation layer 111 may be provided as a single layer or as multiple layers (multilayer). For example, when the first insulation layer 111 is provided as a double layer, a lower layer may include a silicon nitride ($SiN_x$) and an upper layer may include a silicon oxide ($SiO_x$).

The semiconductor 130 is disposed on the first insulation layer 111. The source region 133 and the drain region 135 are respectively disposed at opposite sides of the channel 131, and they are separated from each other. The source region 133 and the drain region 135 are disposed on the same layer of the semiconductor 130, and are directly connected with the semiconductor 130.

The channel 131, the source region 133, and the drain region 135 may include the same material. For example, the channel 131, the source region 133, and the drain region 135 may respectively include the same oxide. Such a metallic oxide may exemplarily include a metal such as zinc (Zn), indium (In), gallium (Ga), tin (Sn), titanium (Ti), and the like, or a combination of a metal such as zinc (Zn), indium (In), gallium (Ga), tin (Sn), titanium (Ti), and the like and an oxide thereof. In further detail, the oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). The channel 131, the source region 133, and the drain region 135 may include a semiconductor material, such as polysilicon.

A carrier concentration of the source region 133 and the drain region 135, which are conductors, is different from that of the channel 131. For example, when the carrier concentration of the channel 131 is, for example, $10^{18}/cm^3$ or less, the carrier concentration of the source region 133 and the drain region 135 may be $10^{18}/cm^3$ or more. A gradient where the carrier concentration is gradually changed may be disposed at a boundary between the source region 133 and the channel 131, or at a boundary between the drain region 135 and the channel 131.

The source region 133 and the drain region 135 may include a material that is reduced from an oxide semiconductor included in the semiconductor 130. For example, the source region 133 and the drain region 135 may further include at least one of fluorine (F), hydrogen (H), and sulfur (S) in addition to the oxide semiconductor included in the semiconductor 130. At least one of fluorine (F), hydrogen (H), and sulfur (S) included in the source region 133 and the drain region 135 may have a concentration of $10^{15}/cm^3$ or more. A gradient where a concentration of at least one of fluorine (F), hydrogen (H), and sulfur (S) is gradually changed may exist at a boundary between the source region 133 and the channel 131 or a boundary between the drain region 135 and the channel 131. The source region 133 and the drain region 135 may be formed by making the oxide semiconductor that forms the semiconductor 130 conductive using plasma treatment and the like. For example, the oxide semiconductor may be made conductive by plasma-treating the oxide semiconductor under a hydrogen gas atmosphere and dispersing hydrogen into the oxide semiconductor such that the source region 133 and the drain region 135 can be formed.

The second insulation layer 140 is disposed on the semiconductor 130. The second insulation layer 140 may be a single layer or multiple layers (multilayer). When the second insulation layer 140 is provided as a single layer, the second insulation layer 140 may include an insulation material such as a silicon oxide ($SiO_x$), a silicon nitride ($SiN_x$), a silicon oxynitride (SiON), aluminum oxide ($Al_2O_3$), hafnium oxide ($HfO_3$), yttrium oxide ($Y_2O_3$), and the like. When the second insulation layer 140 is provided as a multilayer, a lower layer that contacts the semiconductor 130 may include an insulation oxide such as a silicon oxide ($SiO_x$), aluminum oxide ($Al_2O_3$), hafnium oxide ($HfO_3$), yttrium oxide ($Y_2O_3$), and the like to improve an interface property of the semiconductor 130 and prevent permeation of an impurity into the semiconductor 130, and at least one layer that is disposed above the semiconductor 130 may include various insulation materials, such as a silicon oxide ($SiO_x$) and a silicon nitride ($SiN_x$).

The second insulation layer 140 may include a first opening 143 that overlaps the source region 133 and a second opening 145 that overlaps the drain region 135.

An upper electrode 125, a source connection member 153, and a drain connection member 155 are disposed on the second insulation layer 140. The upper electrode 125, the source connection member 153, and the drain connection member 155 are disposed apart from each other, and the source connection member 153 and the drain connection member 155 are disposed at opposite sides of the upper electrode 125.

The source connection member 153 is connected with the source region 133 through the first opening 143, and the drain connection member 155 is connected with the drain region 135 through the second opening 145.

The upper electrode 125, the source connection member 153, and the drain connection member 155 may be formed of a material such as copper (Cu), aluminum (Al), silver (Ag), molybdenum (Mo), chromium (Cr), tantalum (Ta), titanium (Ti), and the like, or a metal alloy thereof. The upper electrode 125, the source connection member 153, and the drain connection member 155 may be provided as a single conductive layer, or may be provided as a multilayer that includes at least two conductive layers, each made of a different material.

A gate line 121, the upper electrode 125, the source connection member 153, and the drain connection member 155 may be referred to as a "gate conductor", and the second insulation layer 140 may be referred to as a "gate insulation layer".

The semiconductor 130 overlaps the upper electrode 125, interposing the second insulation layer 140 therebetween. The second insulation layer 140 may cover most of the semiconductor 130.

A third insulation layer 160 is disposed on the upper electrode 125, the source connection member 153, and the drain connection member 155. The third insulation layer 160 is also called an interlayer insulation layer. The third insulation layer 160 may include an inorganic insulation material such as a silicon oxide ($SiO_x$), a silicon nitride ($SiN_x$), a silicon oxynitride (SiON), silicon oxyfluoride (SiOF), and the like. The third insulation layer 160 may be a single layer or multiple layers (multilayer). When the third insulation layer 160 is provided as a single layer, the third insulation layer 160 may include an inorganic insulation material such as a silicon oxide ($SiO_x$), a silicon nitride ($SiN_x$), a silicon oxynitride (SiON), silicon oxyfluoride (SiOF), and the like, and specifically, may include at least one of a silicon nitride ($SiN_x$) and a silicon oxynitride (SiON) to reduce resistance of the source region 133 and the drain region 135 by injecting hydrogen (H) therein. When the third insulation layer 160 is provided as a multilayer, the lowest layer may include at least one of a silicon nitride ($SiN_x$) and a silicon oxynitride (SiON) that are capable of introducing hydrogen (H) into the source region 133 and the drain region 135, and a middle layer or an upper layer that includes, for example, a silicon oxide ($SiO_x$), may be disposed on the lowest layer. In addition, when the third insulation layer 160 is provided as a multilayer, another layer that includes a material such as a silicon nitride ($SiN_x$) or a silicon oxynitride (SiON) may further be disposed on the middle layer that includes a silicon oxide ($SiO_x$).

The source region 133 and the drain region 135 may become conductive after the oxide semiconductor material is stacked on the substrate 110 and undergoes an additional plasma treatment, but a component such as hydrogen that is included in a gas such as silane ($SiH_4$), ammonia ($NH_3$), and the like, used in a layer forming process of the third insulation layer 160, may be doped to the semiconductor such that the semiconductor may have low resistance or a component, such as hydrogen included in the third insulation layer 160, may spread even after the third insulation layer 160 is formed such that the semiconductor may have low resistance.

The third insulation layer 160 may include a first contact hole 163 that overlaps the source connection member 153, a second contact hole 165 that overlaps the drain connection member 155, and a third contact hole 166 that overlaps the upper electrode 125.

A data conductor that includes the source electrode 173 and the drain electrode 175 is disposed on the third insulation layer 160. The source electrode 173 is connected with the source connection member 153 through the first contact hole 163 of the third insulation layer 160, and is connected with the upper electrode 125 through the third contact hole 166 of the third insulation layer 160. The drain electrode 175 is connected with the drain connection member 155 through the second contact hole 165 of the third insulation layer 160. Thus, the upper electrode 125 is electrically connected with the source region 133.

The data conductor may be made of, for example, a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy thereof. The data conductor may be provided as a single conductive layer, or may be provided as a multilayer that includes at least two conductive layers, each made of a different material.

According to an exemplary embodiment, the upper electrode 125 of the transistor TR is electrically connected to the source region 133 via the source electrode 173 and the source connection member 153, and a source voltage, which is a voltage of the source region 133, may be applied to the upper electrode 125. As described, when the source voltage is applied to the upper electrode 125, a current change rate (i.e., a current slope) in a saturation area is decreased in a voltage-current characteristic graph so that an output saturation characteristic of the transistor TR can be improved. When the transistor TR possesses an excellent output saturation characteristic, the transistor TR becomes insensitive to a voltage fluctuation of the source region 133 that is caused by deterioration of elements, such as an emission element connected to the transistor TR, for example, such that an output current of the transistor TR can be adversely affected to a lesser degree. Thus, the transistor TR according to the present exemplary embodiment can be advantageous as a driving transistor of a display device, such as an organic light emission display, and may also be advantageous to form an external current sensing circuit.

In addition, according to an exemplary embodiment, the source electrode 173 and the drain electrode 175 do not overlap each other, and therefore parasitic capacitance that may occur between the source electrode 173 and the drain electrode 175 can be minimized.

Further, according to an exemplary embodiment, the source connection member 153 and the drain connection member 155 respectively connect the semiconductor 130, the source electrode 173, and the drain electrode 175 through the first opening 143 and the second opening 145 of the second insulation layer 140, and therefore damage to the semiconductor 130 can be minimized, thereby improving reliability of the transistor TR.

The upper electrode 125 may receive a bias rather than being electrically connected to the source region 133. Thus, when a fixed bias is applied to the semiconductor 130, the output saturation characteristic of the transistor TR can be improved, and for example, the output current of the transistor TR can be less affected by a source voltage or a drain voltage in the saturation area of the transistor TR. The upper electrode 125 may be in an electrically floated state rather than being electrically connected to the source region 133 or receiving a bias.

Hereinafter, a method of manufacturing of the transistor display panel shown in FIG. 1 according to an exemplary embodiment will be described with reference to FIG. 2 to FIG. 13.

Figure 3:
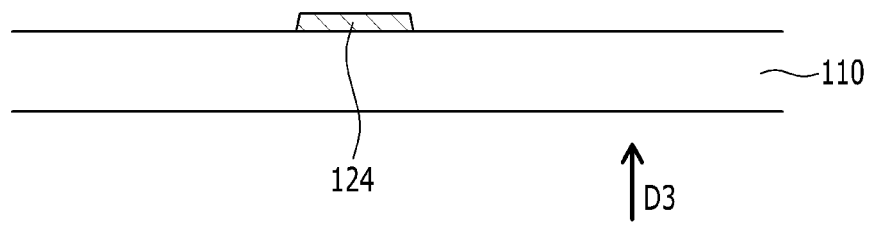
FIG. 3 is a cross-sectional view of FIG. 2, taken along the line III-III'.
Figure 5:
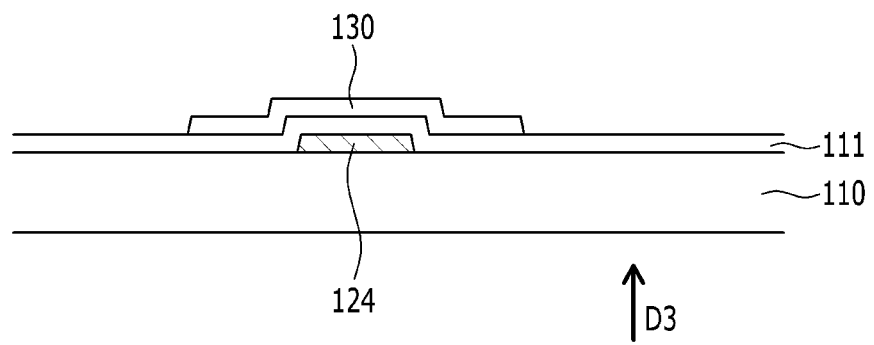
FIG. 5 is a cross-sectional view of FIG. 4, taken along the line V-V'.
Figure 7:
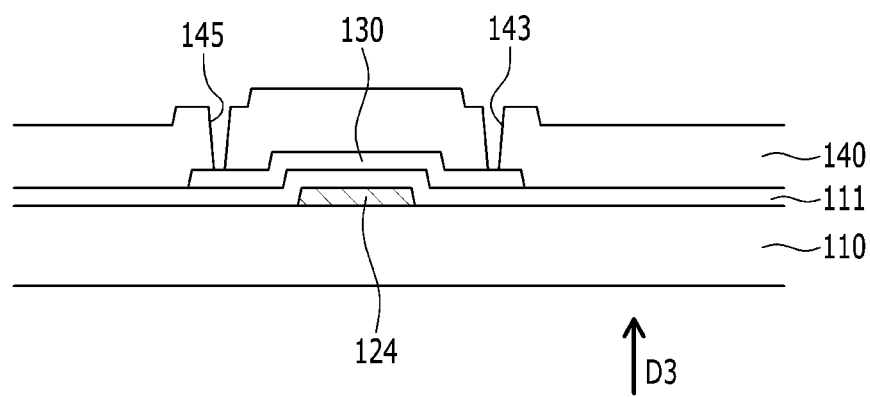
FIG. 7 is a cross-sectional view of FIG. 6, taken along the line VII-VII'.
Figure 8:
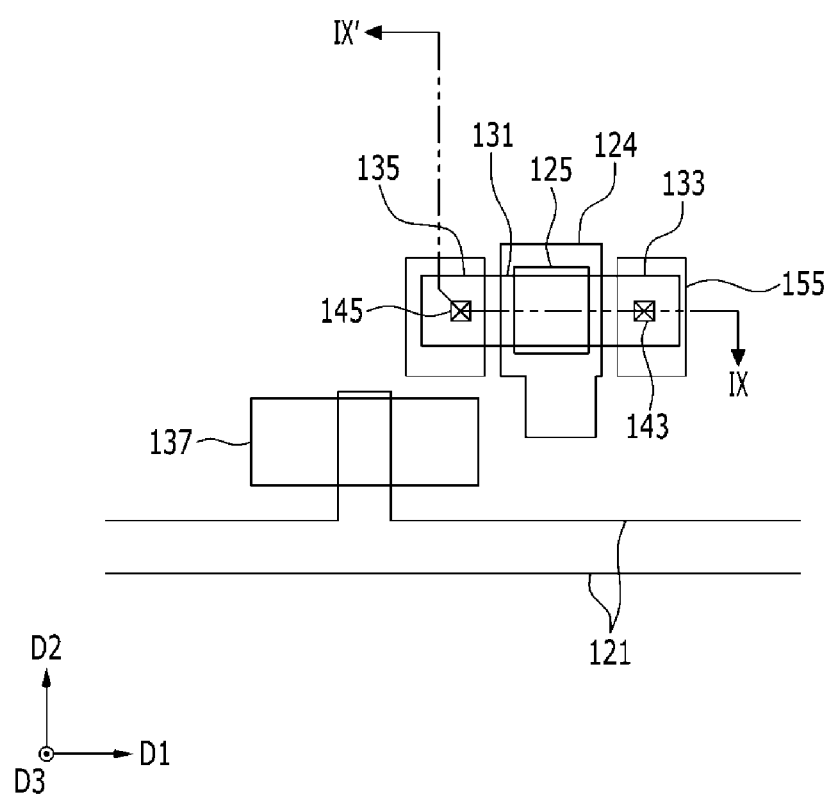
FIG. 8 is a top plan view of the next step of FIG. 6.
Figure 9:
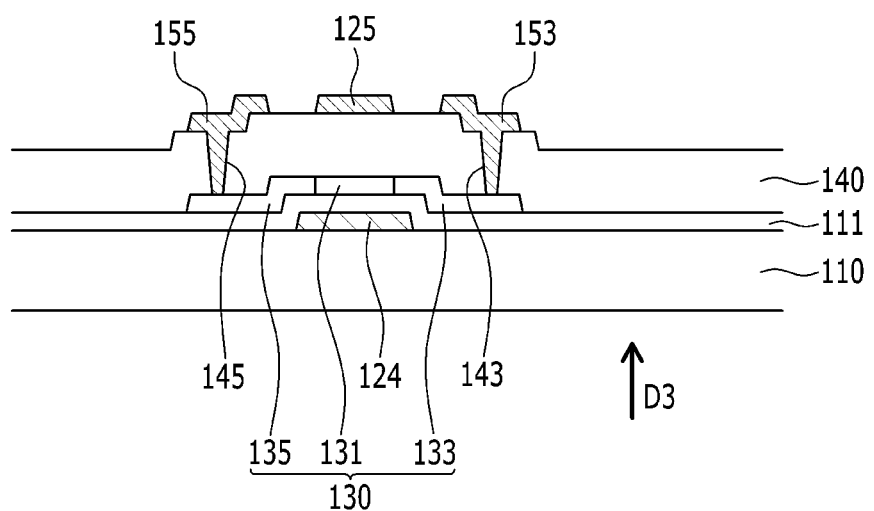
FIG. 9 is a cross-sectional view of FIG. 8, taken along the IX-IX'.
Figure 10:
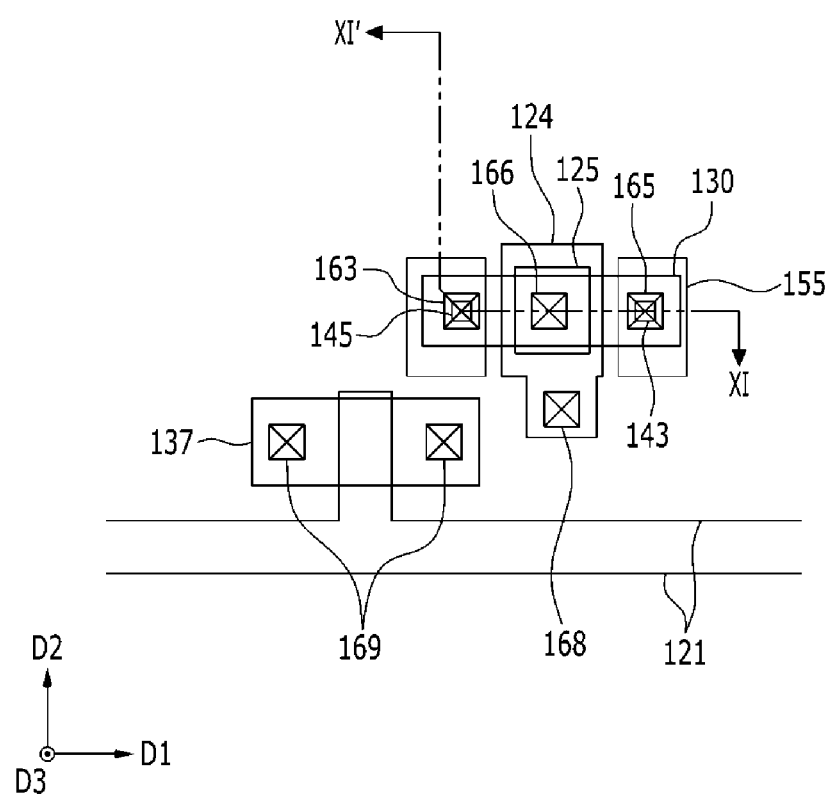
FIG. 10 is a top plan view of the next step of FIG. 8.
Figure 11:
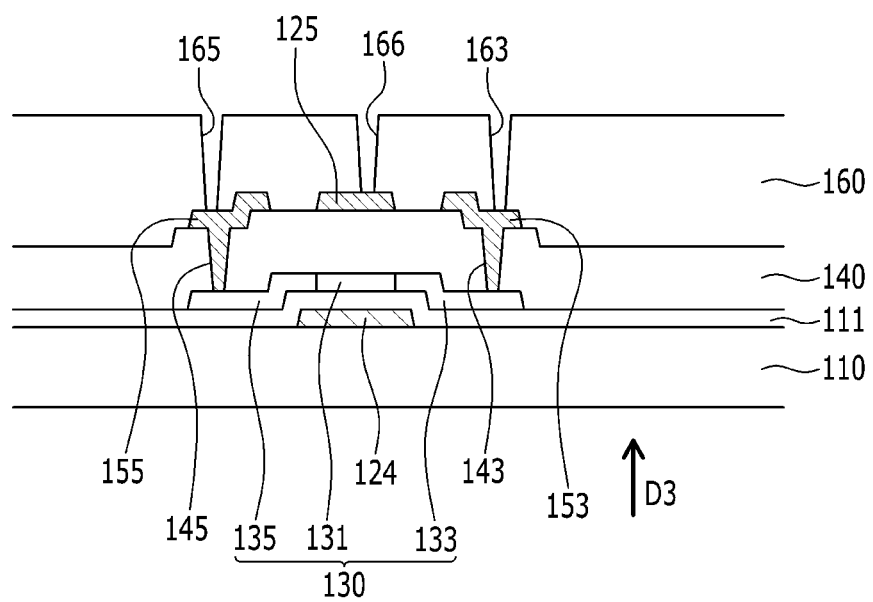
FIG. 11 is a cross-sectional view of FIG. 10, taken along the line XI-XI'.
Figure 12:
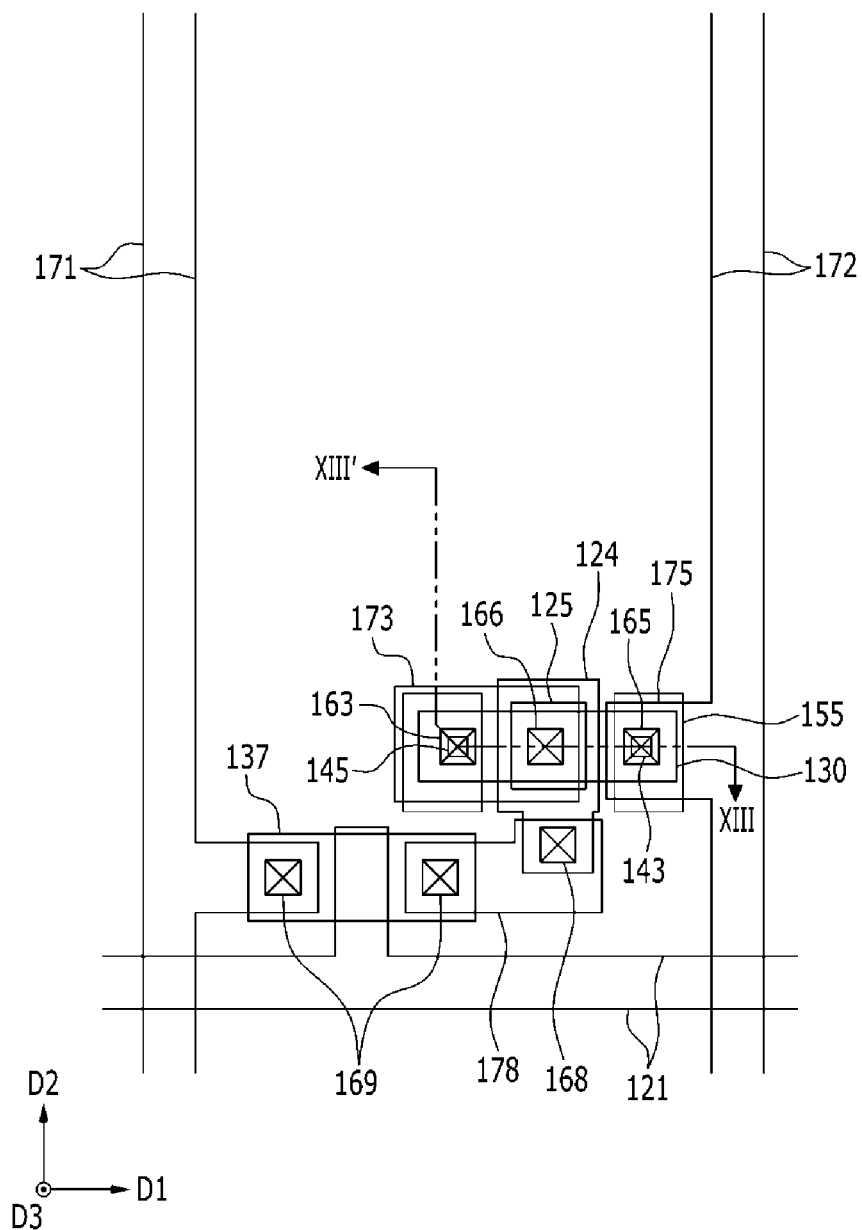
FIG. 12 is a top plan view of the next step of FIG. 10.
Figure 13:
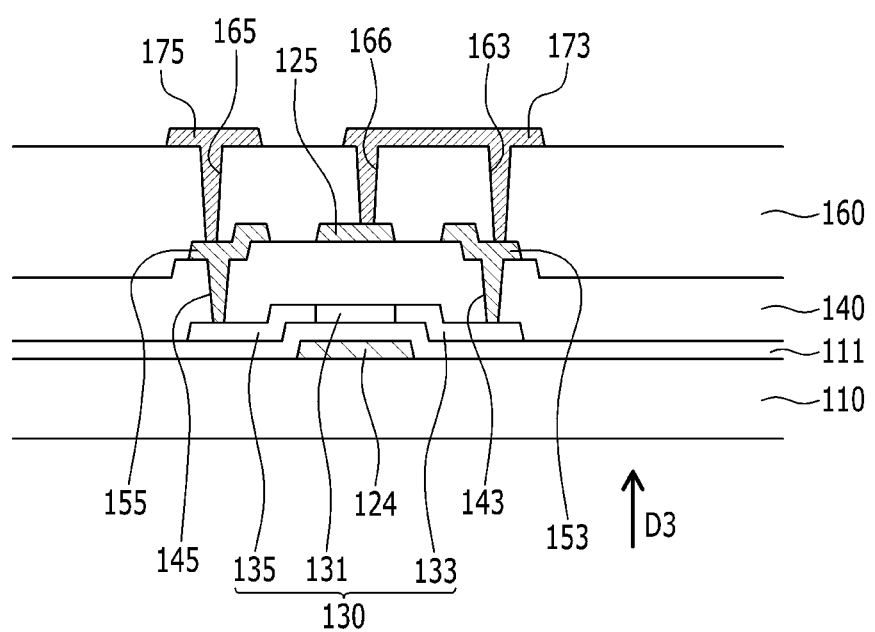
FIG. 13 is a cross-sectional view of FIG. 12, taken along the line XIII-XIII'.

FIG. 2 is a top plan view of a step of the method of manufacturing of the transistor display panel according to the exemplary embodiment. FIG. 3 is a cross-sectional view of FIG. 2, taken along the line III-III'. FIG. 4 shows a top plan view of the next step of FIG. 2. FIG. 5 is a cross-sectional view of FIG. 4, taken along the line V-V'. FIG. 6 is a top plan view of the next step of FIG. 4. FIG. 7 is a cross-sectional view of FIG. 6, taken along the line VII-VII'. FIG. 8 is a top plan view of the next step of FIG. 6. FIG. 9 is a cross-sectional view of FIG. 8, taken along the line IX-IX'. FIG. 10 is a top plan view of the next step of FIG. 8. FIG. 11 is a cross-sectional view of FIG. 10, taken along the line XI-XI'. FIG. 12 is a top plan view of the next step of FIG. 10. FIG. 13 is a cross-sectional view of FIG. 12, taken along the line XIII-XIII'.

In the drawings, a first direction D1 and a second direction D2 are directions that are parallel with a visible plane when viewed from a direction that is perpendicular to a plane of the substrate 110 and are perpendicular to each other, and a third direction D3 is a direction that is perpendicular to the first and second directions D1 and D2, and substantially perpendicular to the substrate 110. The third direction D3 may be displayed mainly in a cross-sectional structure, and may also be called a cross-sectional direction. A structure viewed when observing a plane that is parallel with the first direction D1 and the second direction D2 is called a planar structure. If another component is placed on top of one constituent element in a cross-sectional structure, it implies that the two constituent elements are arranged in the third direction D3, and another constituent element may be disposed between the two constituent elements.

First, as shown in FIG. 2 and FIG. 3, a conductive material, such as a metal, is stacked on the substrate 110 by sputtering and the like, and then patterned by using a photosensitive material, such as a photoresist and a first mask, such that the gate electrode 124 is formed. The gate electrode 124 may also serve as a light blocking film.

Next, as shown in FIG. 4 and FIG. 5, an inorganic insulation material, such as a silicon oxide ($SiO_x$), aluminum oxide ($Al_2O_3$), hafnium oxide ($HfO_3$), yttrium oxide ($Y_2O_3$), and the like is stacked on the substrate 110 where the gate electrode 124 is formed, using chemical vapor deposition (CVD), such that the first insulation layer 111 is formed. The first insulation layer 111 may serve as a buffer layer.

Next, an oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), and the like is deposited on the first insulation layer 111 using chemical vapor deposition and then patterned using a second mask such that the semiconductor 130 is formed. In this case, a switching semiconductor 137 is also simultaneously formed. The switching semiconductor 137 will be described in detail later.

Next, as shown in FIG. 6 and FIG. 7, an inorganic insulation material such as a silicon oxide ($SiO_x$), aluminum oxide ($Al_2O_3$), hafnium oxide ($HfO_3$), yttrium oxide ($Y_2O_3$), and the like is stacked on the substrate 110 where the semiconductor 130 is formed, by using chemical vapor deposition such that the second insulation layer 140 is formed. Subsequently, the second insulation layer 140 is patterned using a third mask such that the first opening 143 that overlaps the source region 133 and the second opening 145 that overlaps the drain region 135 are formed.

In this case, the first opening 143 and the second opening 145 that respectively expose the source region 133 and the drain region 135 may be formed by etching only the second insulation layer 140, and thus, excessive etching of the source region 133 and the drain region 135 can be prevented. Accordingly, a characteristic of the transistor TR can be improved.

Next, as shown in FIG. 8 and FIG. 9, a conductive material, such as a metal, is stacked on the second insulation layer 140 using sputtering and the like such that the gate conductor is formed. A photosensitive material is then stacked on the gate conductor, and the upper electrode 125, the source connection member 153, the drain connection member 155, and the gate line 121 are formed by etching the gate conductor using a fourth mask. The gate line 121 transmits a gate signal Sn, and this will be described in detail later. In this case, the gate conductor may be etched by wet etching or dry etching. Next, hydrogen is dispersed to the semiconductor 130 by performing a plasma treatment in a hydrogen gas atmosphere to make the oxide semiconductor that forms the semiconductor 130 conductive so that the source region 133 and the drain region 135 are formed, and an area not being conductive by being blocked by the upper electrode 125 may be formed as the channel 131.

As shown in FIG. 10 and FIG. 11, an inorganic insulation material, such as a silicon oxide ($SiO_x$), a silicon nitride (SiNx), a silicon oxynitride (SiON), and the like is then stacked on the substrate 110 where the upper electrode 125, the source connection member 153, and the drain connection member 155 are formed, using chemical vapor deposition such that the third insulation layer 160 that has a single layer or multilayer structure is formed.

Next, the third insulation layer 160 is patterned using a fifth mask to form the first contact hole 163 that overlaps the source connection member 153, the second contact hole 165 that overlaps the drain connection member 155, and the third contact hole 166 that overlaps the upper electrode 125. In this case, as shown in FIG. 10, a fourth contact hole 168 that overlaps the gate electrode 124 and a fifth contact hole 169 that overlaps a connection electrode 178 are formed through the same patterning process during which the fifth mask is used.

Thereafter, as shown in FIG. 12 and FIG. 13, a conductive material such as a metal is stacked on the third insulation layer 160 using sputtering and the like and then patterned using a sixth mask such that the data conductor that includes the source electrode 173, the drain electrode 175, and the connection electrode 178 is formed. In this case, the source electrode 173 is connected with the source connection member 153 through the first contact hole 163, and is also connected with the upper electrode 125 through the third contact hole 166. Thus, the upper electrode 125 can be electrically connected to the source region 133 via the source electrode 173 and the source connection member 153. The connection electrode 178 is electrically connected with one end of the gate electrode 124 through the fourth contact hole 168. In addition, the other end of the connection electrode 178 is connected with the switching semiconductor 137 through the fifth contact hole 169. Thus, the connection electrode 178 transmits a signal applied thereto through the switching semiconductor 137 to the gate electrode 124.

Hereinafter, a display device that includes a transistor display panel according to an exemplary embodiment will be described with reference to FIG. 14, FIG. 15, and FIG. 16.

Figure 14:
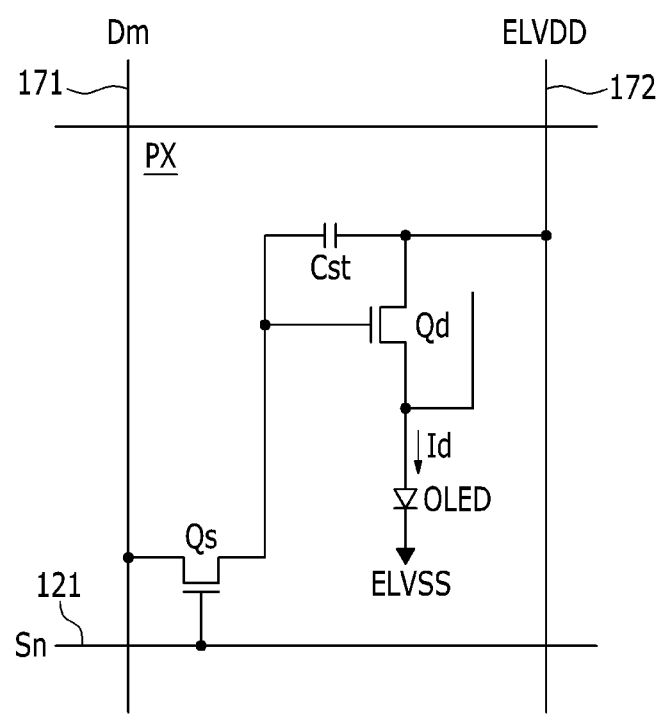
FIG. 14 is an equivalent circuit diagram of a display device that includes a transistor display panel according to an exemplary embodiment.

FIG. 14 is an equivalent circuit of a display device that includes a transistor display panel according to an exemplary embodiment. FIG. 15 is a top plan view of the display device that includes the transistor display panel according to the exemplary embodiment. FIG. 16 is a cross-sectional view of FIG. 15, taken along the line XVI-XVI'.

The display device according to the present exemplary embodiment is an organic light emitting diode display, and may include the transistor according to the above-described exemplary embodiment.

As shown in FIG. 14, one pixel PX of the display device that includes the transistor display panel according to the exemplary embodiment includes a plurality of signal lines 121, 171, and 172, a plurality of transistors Qs and Qd that are connected with the plurality of signal lines 121, 171, and 172, and an organic light emitting diode OLED.

The transistors Qs and Qd include a switching transistor Qs and a driving transistor Qd.

The signal lines 121, 171, and 172 include a plurality of gate lines 121 that transmit a gate signal Sn, a plurality of data lines 171 that transmit a data signal Dm, and a plurality of driving voltage lines 172 that transmit a driving voltage ELVDD.

The switching transistor Qs includes a control terminal, an input terminal, and an output terminal, and the control terminal is connected to the gate line 121, the input terminal is connected to the data line 171, and the output terminal is connected to the driving transistor Qd. The switching transistor Qs transmits the data signal Dm applied to the data line 171 to the driving transistor Qd in response to the data signal Sn applied to the gate line 121.

The driving transistor Qd also includes a control terminal, an input terminal, and an output terminal, and the control terminal is connected to the switching transistor Qs, the input terminal is connected to the driving voltage line 172, and the output terminal is connected to the organic light emitting diode OLED. The driving transistor Qd outputs an output current Id, the magnitude of which varies according to a voltage applied between the control terminal and the output terminal.

The storage capacitor Cst is connected between the control terminal and the input terminal of the driving thin film transistor Qd. In this case, the storage capacitor Cst charges a data signal applied to the control terminal of the driving thin film transistor Qd, and maintains the charge of the data signal after the switching thin film transistor Qs is turned off.

The organic light emitting diode OLED includes an anode connected to the output terminal of the driving thin film transistor Qd and a cathode connected to a common voltage ELVSS. The organic light emitting diode OLED displays an image by emitting light, the strength of which varies depending on a current of the driving thin film transistor Qd.

The switching thin film transistor Qs and the driving thin film transistor Qd may be n-channel field effect transistors (FET) or p-channel field effect transistors. Further, a connection relationship between the switching and driving thin film transistors Qs and Qd, the storage capacitor Cst, and the organic light emitting diode OLED can be changed.

The display device that includes the transistor display panel of FIG. 14 will be described in detail with reference to FIG. 15 and FIG. 16. A description of the above-described constituent elements is omitted.

Figure 15:
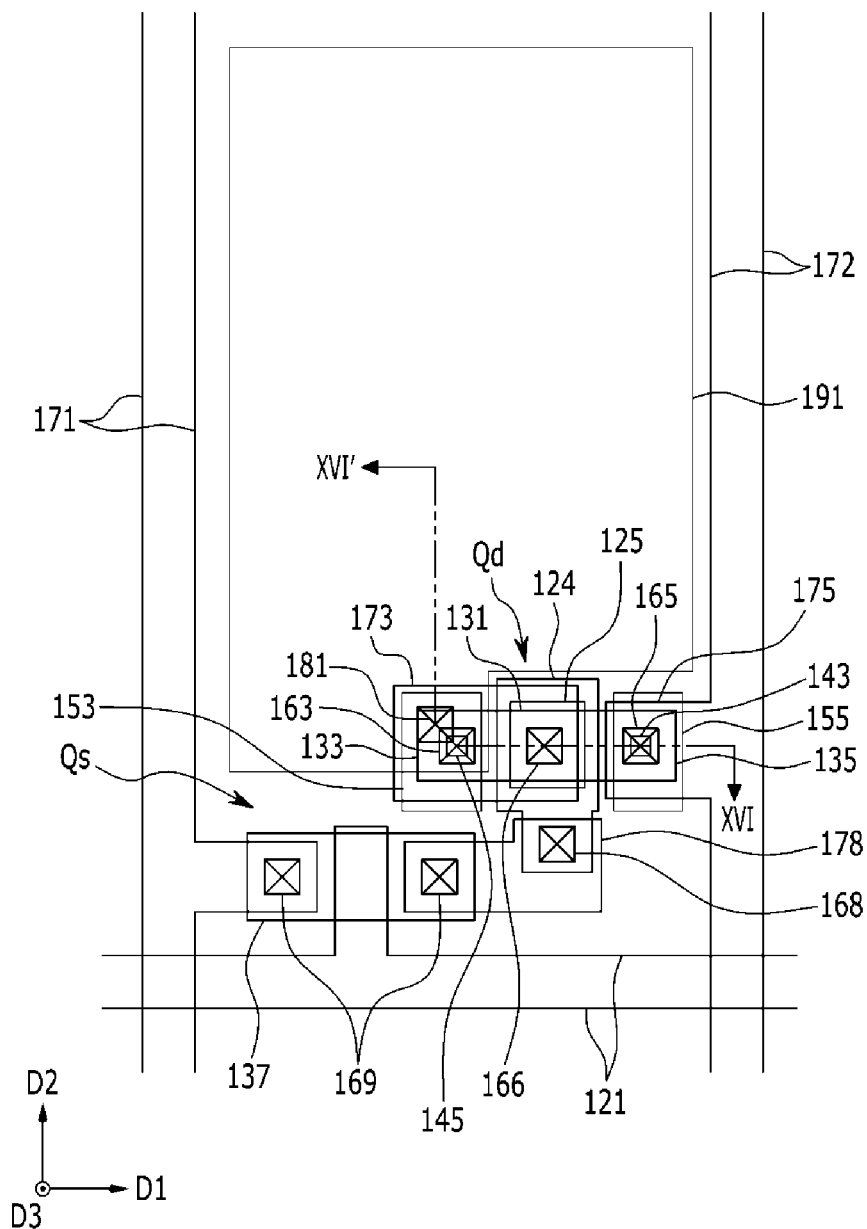
FIG. 15 is a top plan view of the display device that includes the transistor display panel of an exemplary embodiment.
Figure 16:
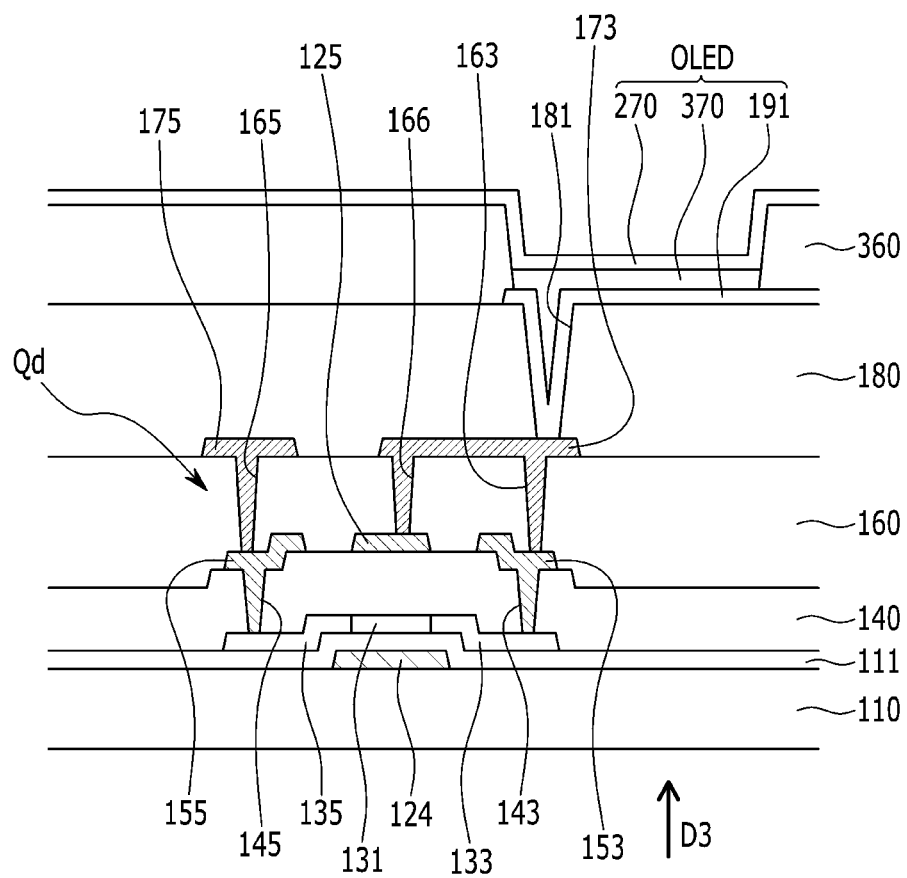
FIG. 16 is a cross-sectional view of FIG. 15, taken along the line XVI-XVI'.

As shown in FIG. 15 and FIG. 16, a passivation layer 180 may be disposed on the third insulation layer 160 and the data conductor. The passivation layer 180 may include at least one of an inorganic insulation material and an organic insulation material, and may be provided as a single layer or a multilayer. The passivation layer 180 may have a substantially flat upper surface. The passivation layer 180 includes a pixel contact hole 181 that overlaps the source electrode 173.

A pixel electrode 191 is disposed on the passivation layer 180. The pixel electrode 191 is electrically connected with the source electrode 173 through the pixel contact hole 181. Accordingly, the pixel electrode 191 is electrically connected with the source region 133 and thus may receive, for example, a data voltage. The pixel electrode 191 may include a transparent conductive material such as indium tin oxide (ITO), indium zinc oxide (IZO), and the like.

A pixel defining layer 360 is disposed on the passivation layer 180 and the pixel electrode 191. The pixel defining layer 360 includes an opening that overlaps the pixel electrode 191. The pixel defining layer 360 may include an inorganic material such as polyacrylics, polyimides, and the like.

An emission layer 370 is disposed in the opening of the pixel defining layer 360 over the pixel electrode 191, and a common electrode 270 is disposed on the emission layer 370. The pixel electrode 191, the emission layer 370, and the common electrode 270 form the organic light emitting diode OLED. The pixel electrode 191 may be an anode of the organic light emitting diode OLED, and the common electrode 270 may be a cathode of the organic light emitting diode OLED.

Light emitted from the emission layer 370 may be reflected several times, passed through the substrate 110, and then be emitted down through the substrate 110, or may be emitted above the substrate 110 without passing through the substrate 110.

An encapsulation layer (not shown) may be disposed on the common electrode 270 to protect the organic light emitting diode OLED.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A transistor display panel comprising:
   a substrate; and
   a transistor disposed on the substrate,
   wherein the transistor comprises:
      a gate electrode disposed on the substrate;
      a semiconductor that overlaps the gate electrode;
      an upper electrode disposed on the semiconductor and overlapping the gate electrode;
      a source connection member and a drain connection member disposed on the same layer as the upper electrode and respectively connected with the semiconductor;
      a source electrode connected with the source connection member and the upper electrode; and
      a drain electrode connected with the drain connection member.

2. The transistor display panel of claim 1, wherein the upper electrode overlaps the semiconductor.

3. The transistor display panel of claim 2, further comprising:
   a first insulation layer disposed between the gate electrode and the semiconductor; and
   a second insulation layer disposed between the semiconductor and the upper electrode.

4. The transistor display panel of claim 3, wherein:
   the second insulation layer comprises a first opening and a second opening that overlap the semiconductor and are disposed apart from each other; and
   the source connection member and the drain connection member are connected with the semiconductor through the first opening and the second opening.

5. The transistor display panel of claim 4, further comprising a third insulation layer that covers the upper electrode, the drain connection member, and the source connection member.

6. The transistor display panel of claim 5, wherein:
   the third insulation layer comprises a first contact hole, a second contact hole, and a third contact hole;
   the first contact hole and the second contact hole respectively overlap the source connection member and the drain connection member;
   the source electrode is connected with the source connection member and the upper electrode through the first contact hole and the third contact hole; and
   the drain electrode is connected with the drain connection member through the second contact hole.

7. The transistor display panel of claim 1, further comprising a pixel electrode that is electrically connected with the source electrode.

8. The transistor display panel of claim 1, wherein the semiconductor comprises an oxide semiconductor.

9. The transistor display panel of claim 6, further comprising:
   a switching semiconductor spaced apart from the semiconductor and disposed on the same layer as the semiconductor; and
   a gate line disposed on the switching semiconductor, disposed on the same layer as the upper electrode, and transmitting a gate signal,
   wherein a portion of the gate line overlaps the switching semiconductor.

10. The transistor display panel of claim 9, further comprising a connection electrode disposed on the same layer as the source electrode and connecting the switching semiconductor and the gate electrode.

11. The transistor display panel of claim 10, wherein:
    the third insulation layer has a fourth contact hole overlapping the gate electrode, and a fifth contact hole overlapping the connection electrode; and
    one end portion of the connection electrode is connected to the gate electrode through the fourth contact hole, and the other end portion of the connection electrode is connected to the switching semiconductor through the fifth contact hole.

12. The transistor display panel of claim 10, wherein one end portion of the connection electrode overlaps the gate electrode in a plane view, and the other end portion of the connection electrode overlaps the switching semiconductor in a plane view.

13. The transistor display panel of claim 10, wherein the switching semiconductor comprises an oxide semiconductor.

14. The transistor display panel of claim 10, further comprising a data line disposed on the same layer as the connection electrode,
    wherein a portion of the data line overlaps the switching semiconductor.

15. The transistor display panel of claim 14, wherein the portion of the data line is connected to the switching semiconductor.

16. A method of manufacturing a transistor display panel, comprising forming a transistor on a substrate,
    wherein the forming of the transistor comprises:
       forming a gate electrode on the substrate;
       forming a semiconductor that overlaps the gate electrode;
       forming an upper electrode, a source connection member, and a drain connection member, wherein the upper electrode overlaps the semiconductor and the gate electrode, and the source connection member and the drain connection member are connected with the semiconductor; and
       forming a source electrode that is connected with the upper electrode and the source connection member and a drain electrode that is connected with the drain connection member.

17. The method of claim 16, wherein the upper electrode is formed on the semiconductor.

18. The method of claim 17, further comprising:
    forming a first insulation layer that covers the gate electrode;
    forming a second insulation layer that covers the semiconductor; and
    forming a first opening and a second opening in the second insulation layer, the first opening and the second opening overlapping the semiconductor,
    wherein the source connection member and the drain connection member are connected with the semiconductor respectively through the first opening and the second opening.

19. The method of claim 18, further comprising forming a third insulation layer that covers the upper electrode, the drain connection member, and the source connection member.

20. The method of claim 19, further comprising forming a first contact hole, a second contact hole, and a third contact hole, wherein:
- the first contact hole and the second contact hole respectively overlap the source connection member and the drain connection member;
- the third contact hole overlaps the upper electrode; and
- the source electrode is connected with the source connection member and the upper electrode through the first contact hole and the third contact hole, and the drain electrode is connected with the drain connection member through the second contact hole.

* * * * *